(12) United States Patent
Ritter et al.

(10) Patent No.: US 11,195,825 B2
(45) Date of Patent: Dec. 7, 2021

(54) MULTI-DIODE SEMICONDUCTOR DEVICE AND METHOD OF OPERATION THEREFOR

(71) Applicant: NEXPERIA B.V., Nijmegen (NL)

(72) Inventors: Hans-Martin Ritter, Hamburg (DE); Andreas Zimmerman, Hamburg (DE)

(73) Assignee: Nexperia B.V., Nijmegen (NL)

( * ) Notice: Subject to any disclaimer, the term of this patent is extended or adjusted under 35 U.S.C. 154(b) by 193 days.

(21) Appl. No.: 16/253,261

(22) Filed: Jan. 22, 2019

(65) Prior Publication Data

US 2019/0229109 A1    Jul. 25, 2019

(30) Foreign Application Priority Data

Jan. 25, 2018 (EP) .................................... 18153485

(51) Int. Cl.
*H01L 27/02* (2006.01)
*H02H 9/04* (2006.01)
*H01L 27/06* (2006.01)

(52) U.S. Cl.
CPC ...... *H01L 27/0255* (2013.01); *H01L 27/0266* (2013.01); *H01L 27/0285* (2013.01); *H01L 27/0629* (2013.01); *H02H 9/046* (2013.01)

(58) Field of Classification Search
CPC ............. H01L 27/0255; H01L 27/0266; H01L 27/0285; H01L 27/0629
See application file for complete search history.

(56) References Cited

U.S. PATENT DOCUMENTS

| 2004/0070901 | A1 | 4/2004 | Umeda | |
|---|---|---|---|---|
| 2006/0098363 | A1 | 5/2006 | Hebert et al. | |
| 2008/0013233 | A1* | 1/2008 | Otake | H01L 27/0266 361/56 |
| 2012/0098046 | A1 | 4/2012 | Kim | |
| 2015/0187752 | A1* | 7/2015 | Salman | H01L 27/0259 257/526 |
| 2017/0338809 | A1* | 11/2017 | Stefanov | H01L 27/0727 |

FOREIGN PATENT DOCUMENTS

DE        102007018237 A1    10/2008

OTHER PUBLICATIONS

European Search Report and Written Opinion for corresponding European application EP18153485, dated Jun. 26, 2018, 6 pages.

* cited by examiner

*Primary Examiner* — Kyle J Moody
*Assistant Examiner* — Jye-June Lee
(74) *Attorney, Agent, or Firm* — Ohlandt, Greeley, Ruggiero & Perle, LLP

(57) ABSTRACT

A semiconductor device arrangement and a method of operating a semiconductor device arrangement. The semiconductor device can be arranged for bidirectional operation. The semiconductor device arrangement can comprise: a field effect transistor comprising first and second input terminals; a control terminal; a first diode connected between the first terminal and the control terminal; and a second diode connected between the second terminal and the control terminal; wherein the first terminal and the second terminal are configured and arranged to be connected to respective signal lines.

10 Claims, 7 Drawing Sheets

MULTI-DIODE SEMICONDUCTOR DEVICE AND METHOD OF OPERATION THEREFOR

CROSS REFERENCE TO RELATED APPLICATION

The present application claims foreign priority to European Patent Application No 18153485.0, filed on Jan. 25, 2018, the entirety of which is incorporated by reference hereby.

FIELD

The present disclosure relates to a semiconductor device and method of operation. In particular the present disclosure relates to a bidirectional device and associated method of operation. More particularly, the disclosure relates to a bidirectional ESD protection device.

BACKGROUND

Electro-Static Discharge protection semiconductor devices can generally be classified as unidirectional or bidirectional. Unidirectional ESD protection devices can be suitable for protecting circuits where ESD events are typically above or below a predetermined reference voltage. Unidirectional devices are thus characterised by an asymmetrical IV (current–voltage) characteristic; for one polarity the breakdown voltage is defined by a forward biased pn-junction, for the other opposite polarity the breakdown voltage is much larger. Bidirectional ESD protection devices can be suitable for protecting circuits where ESD events are above and below a predetermined reference voltage. Bi-directional devices are thus characterised by a symmetrical IV (current–voltage) characteristic; for both polarities the breakdown voltage is much larger than a forward voltage.

For some applications the breakdown voltage of a bidirectional device can be smaller than 6 Volts, for example in the range of 2 to 4 Volts. At the same time the leakage current should be small; this means smaller than 1 µA, preferably smaller than 1 nA.

Bidirectional ESD protection can be provided by two back to back, that is anode to anode, or cathode to cathode connected Zener diodes. However, with this arrangement it is not possible to achieve a breakdown voltage well below 6 Volt and at the same time a low leakage current, due to Zener tunneling being the predominant breakdown mechanism.

Metal-Oxide Semiconductor (MOS) diodes are known to have low switching voltages and low leakage currents thus making them suitable for ESD protection devices. However, because the gate of the MOS transistor has to be connected to one of the two terminals (drain or source) bidirectional functionality is not possible.

SUMMARY

According to an embodiment there is provided a semiconductor device arrangement for bidirectional operation, the semiconductor device arrangement comprising: a field effect transistor comprising first and second input terminals; a control terminal; a first diode connected between the first terminal and the control terminal; and a second diode connected between the second terminal and the control terminal; wherein the first terminal and the second terminal are configured and arranged to be connected to respective signal lines.

Optionally, an anode of the first diode is connected to the first terminal and a cathode of the first diode is connected to the control terminal, and an anode of the second diode is connected to the first terminal and a cathode of the second diode is connected to the control terminal.

Optionally, a cathode of the first diode is connected to the first terminal and an anode of the first diode is connected to the control terminal, and a cathode of the second diode is connected the second terminal and an anode of the second diode is connected to the control terminal.

The field effect transistor can further comprise a semiconductor substrate of a first conductivity type; and first and second terminal regions are formed of a second conductivity type separated by the semiconductor region, wherein the first conductivity type is opposite to the second conductivity type; and a body terminal connected to the semiconductor substrate.

Optionally, the semiconductor substrate can comprise: a first body diode arranged between the body terminal and the first terminal region; and a second body diode arranged between the body terminal and the second terminal region. The semiconductor substrate can comprise: a first body diode arranged between the body terminal and the first terminal region; and a second body diode arranged between the body terminal and the second terminal region.

An electrostatic discharge protection arrangement can comprise the semiconductor device arrangement according to embodiments.

An integrated circuit can comprise a first domain and a second domain. The first domain can be connected to the second domain by the semiconductor device arrangement according to embodiments.

According to an embodiment there is provided a method of operating a semiconductor device arrangement, comprising: connecting a first terminal of the device to a first signal line carrying a first bias voltage and connecting the second terminal to a second signal line carrying a second bias voltage; forward biasing a first diode connected between the first terminal and a control terminal and reverse biasing a second diode connected between the second terminal and the control terminal; wherein the voltage on the control terminal will be substantially equal to the voltage on the first terminal.

Optionally, the voltage on the control terminal can be equal to the bias voltage less the forward voltage of the first diode. The first and second terminals and control terminals can be the terminals of a field effect transistor. The field effect transistor can further comprise a first body diode and a second body diode, wherein the first body diode is in blocking mode and the second body diode is in forward mode, such that a further terminal region of the field effect transistor is substantially equal to the voltage on the second terminal. Optionally, the voltage on the further terminal can be higher than the voltage on the second terminal by an equal to the forward voltage the second body diode.

According to an embodiment there is also provided a method of manufacturing a semiconductor device arrangement for bidirectional operation, the method comprising: forming a field effect transistor comprising first and second input terminals and a control terminal; arranging a first diode to be connected between the first terminal and the control terminal; arranging a second diode to be connected between the second terminal and the control terminal; wherein the first terminal and the second terminal are configured and arranged to be connected to respective signal lines.

DESCRIPTION OF THE DRAWINGS

In the figures and the following description like reference numerals refer to like features.

The invention is described further hereinafter by way of example only with reference to the accompanying drawings in which:

FIG. 2 illustrates an equivalent circuit of a semiconductor device for bidirectional operation according to the embodiment of FIG. 1a;

Figure 1A:
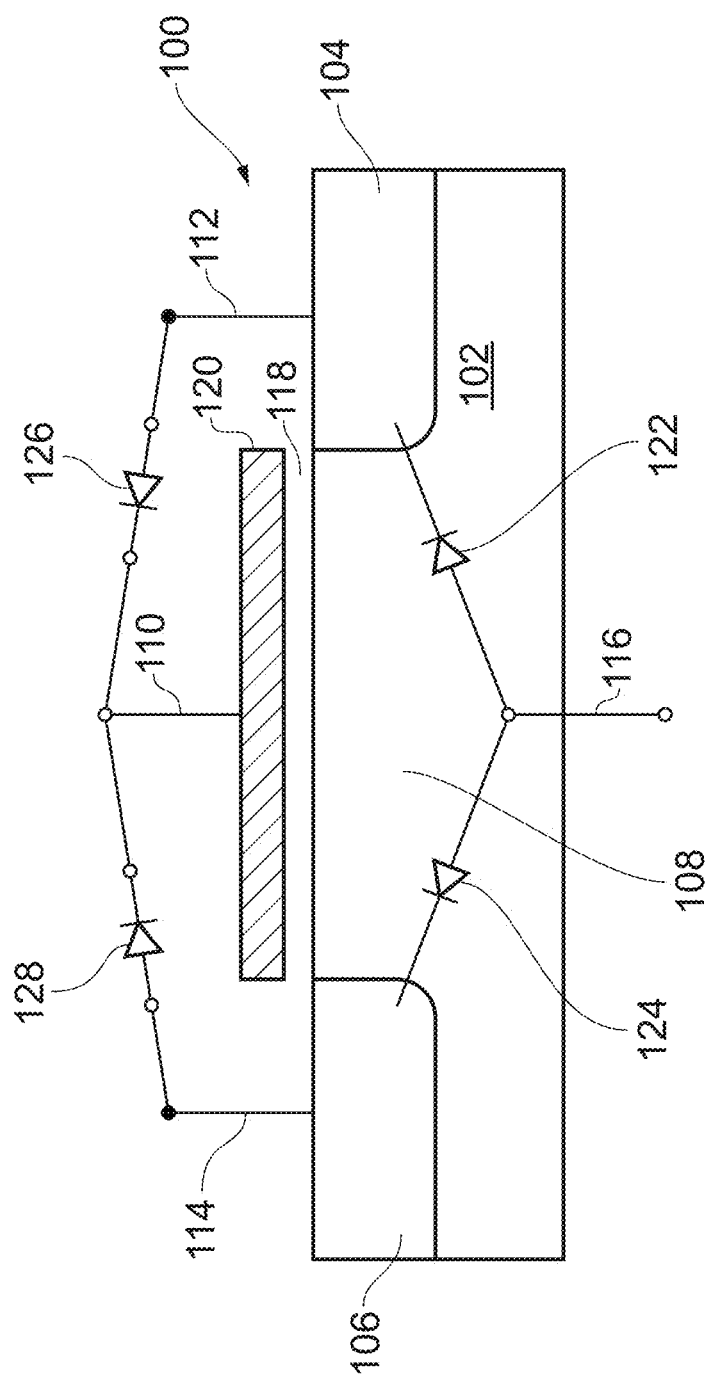
FIG. 1a is a schematic illustration of a semiconductor device for bidirectional operation according to an embodiment.

A semiconductor device 100 for bidirectional ESD protection, according to embodiments is illustrated in FIG. 1. The semiconductor device 100 comprises a semiconductor substrate 102 formed of a first conductivity type. A first terminal region 104 and a second terminal region 106 are formed in the semiconductor substrate 102, such that the first terminal region 104 is separated from the second terminal region 106 by a dividing portion of the semiconductor substrate 102. This dividing portion of the semiconductor substrate 102 creates a channel (or inversion) region 108 of the semiconductor device 100 during operation.

A control terminal 110 is arranged above the dividing portion semiconductor substrate 102 forming the channel (or inversion) region 108. A first terminal 112 is formed on the first terminal region 104, and a second terminal 114 is formed on the second terminal region 106. A further terminal region 116 can be formed on the semiconductor substrate 102, opposing the control terminal 110 and the first and second terminal regions 104, 106.

The control terminal is formed of MOS structure, by forming an oxide 118, such as $SiO_2$, on the semiconductor substrate 102 over the portion of the substrate where the channel (or inversion) region 108 is created during operation of the device. A contact layer 120 formed of a metallic layer, or alternatively a polycrystalline silicon layer, is then formed on the oxide complete the control terminal 110.

The first terminal region 104 and a second terminal region 106 can be formed by implantation and/or diffusion into the semiconductor substrate 102. Appropriate metal contacts are then formed on the first terminal region 104 and a second terminal region 106 to form the first terminal 112 and second terminal 114 respectively.

Figure 1B:
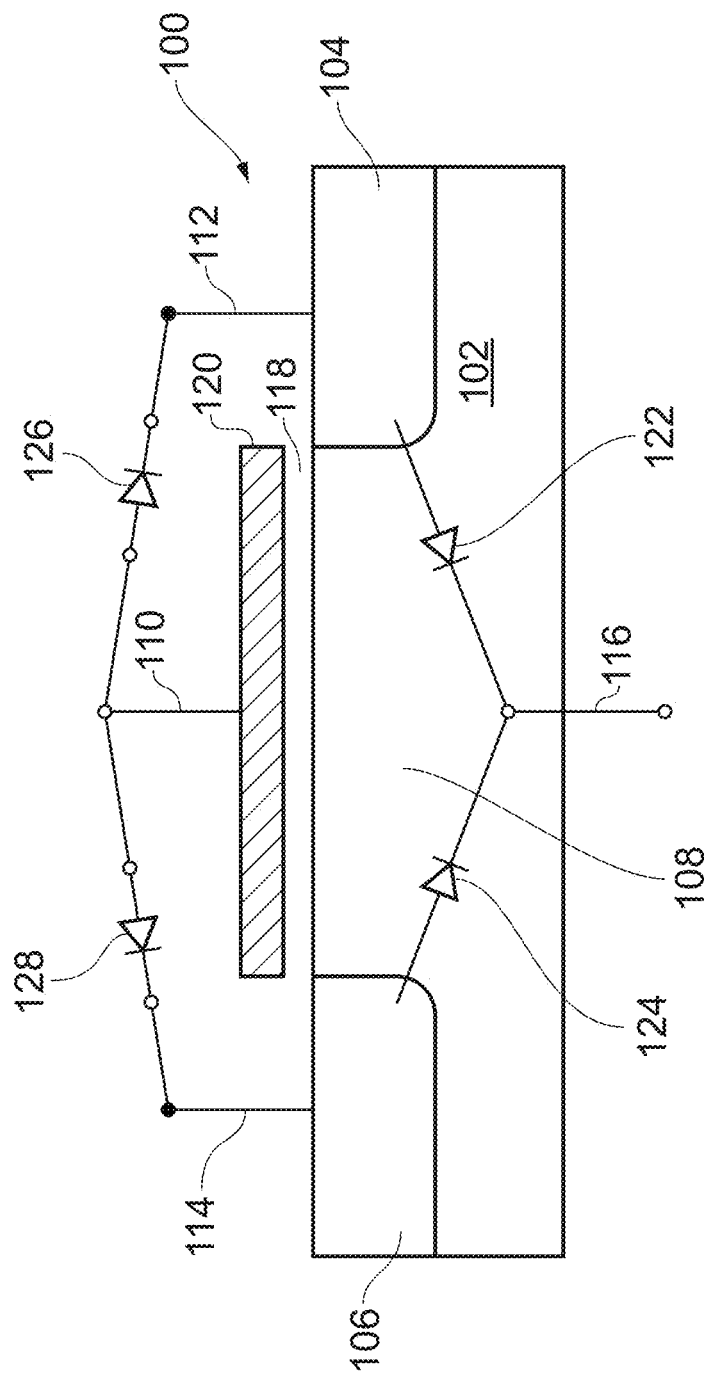
FIG. 1b is a schematic illustration of a semiconductor device for bidirectional operation according to an embodiment.

In the context of the present disclosure, the semiconductor substrate 102 can also be termed the body of the semiconductor device 100 and the further terminal 116 can be termed the body terminal. The arrangement of first terminal region 104 and a second terminal region 106 having opposite conductivity types to the semiconductor substrate 102, or body, forms so-called body diodes between the semiconductor substrate 102 the respective first and second terminal regions. Specifically, a first body diode 122 is created between the first terminal region 104, of first conductivity type, and the semiconductor substrate 102 of second conductivity type. A second body diode 124 is created between the first terminal region 106 of first conductivity, and the semiconductor substrate of second conductivity type. FIG. 1a shows first and second body diodes 122, 124 in an embodiment where the semiconductor substrate 102 is p-doped. In that case both anodes of the first and second body diodes 122 and 124 are formed by the semiconductor substrate 102. Likewise, FIG. 1b illustrates the embodiment where the semiconductor substrate 102 is n-doped. The skilled person will appreciate that the cathodes of the first and second body diodes 122, 124 are thus formed by the n-type semiconductor substrate 102. The arrangements of FIGS. 1a and 1b are effectively MOS transistors.

In addition to the first and second body diodes 122, 124, further control terminal diodes 126, 128 can be connected between the control terminal 110 and the first terminal 112 and the second terminal 114. A first control terminal diode 126 is connected between the first terminal 112 and the control terminal 110 and a second control terminal diode 128 is connected between the second terminal 114 and the control terminal 110. The first control terminal diode 126 and the second control terminal diode 128 can be is integrated on the substrate or they can be connected externally between the first terminal 112 and the control terminal 110, and the second terminal 114 the control terminal 110 respectively. Through the arrangement of first and second body diodes 122, 124 and first and second control terminal diodes 126, 128 the structure of the device arrangement is therefore said to symmetrical. FIG. 1a shows first and second control terminal diodes 126, 128 for the case where the semiconductor substrate is p-doped. In this case the cathodes of the first and second control terminal diodes 126 and 128 are connected to the control terminal 110. As illustrated in FIG. 1b it would be clear to a person skilled in the art, that where the semiconductor substrate 102 is n-doped, both anodes of the first and second control terminal diodes 126 and 128 are connected to control terminal 110.

Figure 2:
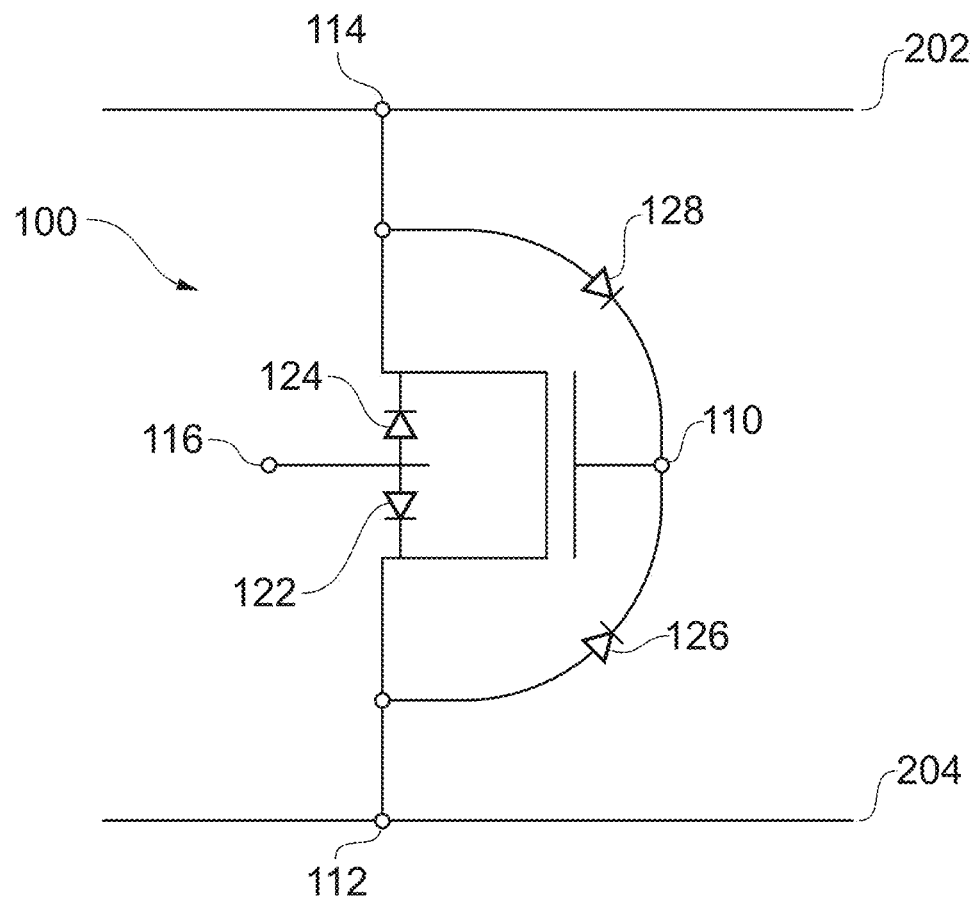

An equivalent circuit of the arrangement of FIG. 1a is illustrated in FIG. 2, and like reference numerals correspond to like features. In FIG. 2, the semiconductor device 100 for bidirectional operation is connected across two signal lines 202, 204 with different potentials. The first terminal 112 is connected to the first signal line 204 and the second terminal 114 is connected to the second signal line 202. For example, the first signal line 204 can be a ground line, and the second signal line 202 can be a bias voltage line for a further circuit (not illustrated) to be protected. The voltage on the second signal line 202, can be either a positive voltage or a negative voltage with respect to the first signal line 204. Due to the inherent symmetry of the device 100, the behaviour of the device is similar regardless of the polarity of voltage on the either the first or second signal lines 202, 204.

The voltage across the signal lines 202, 204 can be an ESD event or bias voltage. Assuming the voltage on the signal line 202, that is the voltage on the second terminal 114, is positive, the second control terminal diode 128 will be forward biased and therefore conduct. Consequently, first control terminal diode 126 will be reverse biased and therefore in blocking mode. In an ideal situation, that is assuming no voltage drop across the second control terminal diode 128, the voltage on the control terminal 110 will be equal or substantially equal to the bias voltage on the second terminal 114. In practice, however, the reverse biased first control terminal diode 126 can exhibit a leakage current. This leakage current can flow through the forward biased second control terminal diode 128, causing a voltage drop across the diode depending on the current level. Thus in practice the voltage on the control terminal 110 will be smaller is than the bias voltage by an amount equal to the forward voltage of the second control terminal diode 128. Since the leakage current of reverse biased first control terminal diode 126 will be small (for example smaller than 100 pA) the forward voltage drop of diode 128 will be in the range of 300 mV up to 400 mV.

Furthermore, where the bias voltage is positive, the second body diode 124 will be in blocking mode and consequently the first body diode 122 will be forward biased and therefore conduct and the voltage on further terminal region 116 will, in the ideal situation be substantially equal to ground potential. In practice, however, due to the forward voltage of the forward biased first body diode 122, the voltage on further terminal region 116 will be higher than the ground potential by an amount equal to the forward voltage of first body diode 122. As before, since the leakage current of the reverse biased second body diode 124 will be small (for example smaller than 100 pA) the forward voltage drop of diode 122 will be in the range of 300 mV up to 400 mV.

In this way, the voltage on control terminal 110 will be higher than the voltage on control terminal 116. When the voltage difference between terminals 110 and 116 exceeds the threshold voltage+$V_{th}$ a channel (or inversion) region 108 is created that connects the two diffusion areas 104 and 106, so that current can flow from terminal 114 to terminal 112.

In the case where the voltage on the signal line 202, that is the voltage on the second terminal 114, is negative compared to the voltage on the first terminal 112 (for the sake of simplicity in this example connected to ground), the second control terminal diode 128 will be reversed biased and therefore in blocking mode. Consequently, first control terminal diode 126 will be forward biased and therefore conducting. In the ideal situation, that is assuming no voltage drop across the first control terminal diode 126, the voltage on the control terminal 110 will be identical to the ground voltage. In practice, however, due to the forward voltage of the forward biased first control terminal diode 126, the voltage on the control terminal 110 will be lower than the ground voltage by an amount equal to the forward voltage first control terminal diode 126.

Furthermore, where the bias voltage is negative, the second body diode 122 will be in blocking mode and consequently the first body diode 124 will be forward biased and therefore conduct and the voltage on body terminal 116 will, in the ideal situation equal to the negative bias voltage, but in practice be equal to the bias voltage plus the forward voltage of the first body diode 124.

In this case the voltage on control terminal 110 will be higher than the voltage on control terminal 116. When the voltage difference between the control terminal 110 and terminal 116 exceeds the threshold voltage+$V_{th}$ a channel (or inversion) region 108 is created that connects the two diffusion areas 104 and 106, so that current can flow from terminal 112 to terminal 114.

In summary, the operation of the device can be described as follows. When the bias voltage or ESD event is positive:
  The potential on the control terminal 110 will, as described above, be the bias voltage less the forward voltage of the second control terminal diode; and
  The potential on the further terminal region 116 will be at ground, plus the forward voltage of the first body 122.
When the bias voltage or ESD event is negative:
  The potential on the control terminal 110 will be at ground, less the forward voltage of the first control terminal diode; and
  The potential on the further terminal region 116 will be the bias voltage plus the forward voltage of the second body diode 124.
In both cases the potential on gate terminal 110 will be higher than the potential on the body terminal 116

Figure 3:
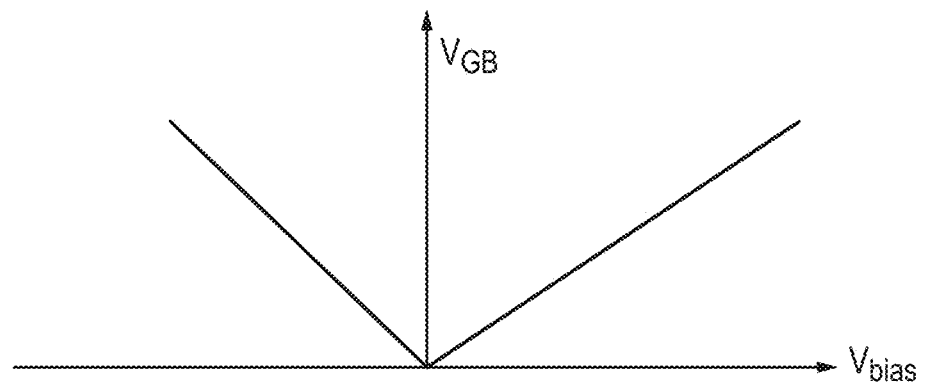
FIG. 3 illustrates a graph of the potential difference $V_{gate-body}$ versus bias voltage $V_{bias}$.
Figure 4:
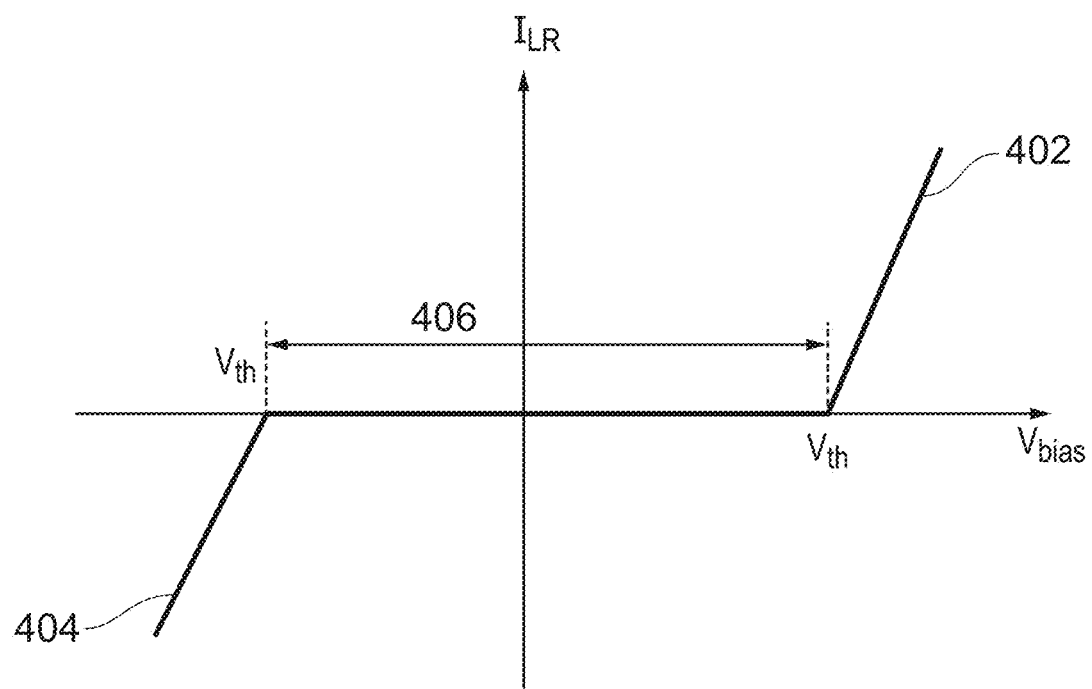
FIG. 4 illustrates a typical current-voltage (I-V) characteristic of a semiconductor device according to an embodiment.

FIG. 3 illustrates a plot of the gate—body potential difference $V_{GB}$, between control terminal 110 and the body terminal 116 on the vertical axis, and the bias voltage $V_{bias}$, between the first terminal 114 and the second terminal 112, on the horizontal axis. The relationship between the bias voltage $V_{bias}$, in both the positive and negative situations described above and the potential difference between the control terminal 110 (or gate of the semiconductor device) and the body terminal 116 $V_{GB}$ is positive. Also, as the bias voltage $V_{bias}$ increases the potential difference $V_{GB}$ increases linearly. As mentioned above, in the ideal situation the potential difference $V_{GB}$ follows the bias voltage $V_{bias}$. In reality however, the potential difference $V_{GB}$ will be less than the bias voltage $V_{bias}$ by the forward voltage of the relevant forward conducting diodes. In both positive and negative bias voltage $V_{bias}$ situations, the absolute potential difference (that is the magnitude, not the polarity) between the control terminal 110 and the body terminal 116 is therefore always positive. In both situations, the device will switch to the conduction mode when the potential difference between lines 202 and 204 is larger than the threshold voltage of the transistor FIG. 4 illustrates a typical current voltage (I-V) characteristic of the semiconductor device 100 according to embodiments, where the vertical axis $I_{SR}$ corresponds to the current flowing from line 202 to line 204 (in other words from the second terminal 114 to the first terminal 112) and the horizontal axis corresponds to the bias voltage $V_{bias}$, that is, the potential difference between line 201 and line 204 (or from the second terminal 114 to the first terminal 112) In the case of a positive bias voltage $V_{bias}$ which is larger than a positive threshold voltage+$V_{th}$ (the threshold voltage of the MOS transistor) the semiconductor device operates in the positive forward conduction mode region 402. Likewise, in the case of a negative bias voltage $V_{bias}$ whose value is larger than a threshold voltage $V_{th}$ the semiconductor device operates in the negative conduction mode region 404.

Furthermore, in the case of a positive or negative bias voltage $V_{bias}$ whose value is less than the threshold voltage $V_{th}$, the device will be in blocking mode 406.

Therefore, according to embodiments, semiconductor device 100 can be seen as bidirectional MOS-diode which is capable of symmetrical operation.

The threshold voltage or $V_{th}$ can be selected by the appropriate selection of the process settings such as for example the doping levels of the substrate and/or diffusion layers in the bulk below the control terminal 110.

Applications of the semiconductor device 100 according to embodiments can include on-board, for example on a printed circuit board (PCB), ESD or surge protection. Where the semiconductor device 100 is arranged to protect a signal line or contact pad on the PCB against electrical overstress.

Optionally, the semiconductor device 100 can be placed between across two signal lines, as illustrated in FIG. 2) in order to limit the voltage difference between the lines 202 and 204.

The semiconductor device 100 can also be placed between a signal line and a voltage reference line (for example a ground line). As shown in FIG. 2 line 202 can be a signal line and line 204 can be a ground line. The device 100 will limit the voltage difference between the signal line and the ground line for both positive and negative polarity on line 202.

Figure 5:
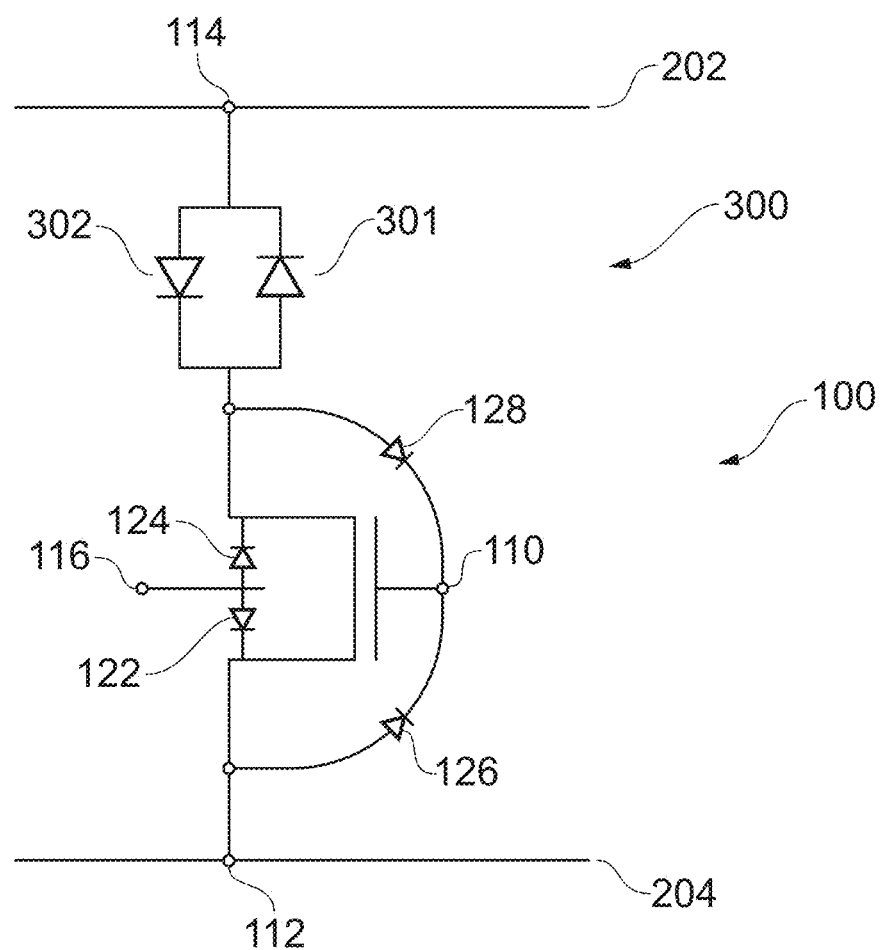
FIG. 5 illustrates the equivalent circuit of FIG. 2 including an arrangement of anti-parallel diodes.

In applications where low parasitic capacitance is required, for example in serial interfaces such as USB2.0 or HDMI, the semiconductor device can be combined with low capacitance steering diodes. In FIG. 5 a pair 300 of two antiparallel diodes 301 and 302 are placed in series with the semiconductor device 100. Diodes 301 and 302 can be chosen small because such that current will only flow in forward bias direction through these diodes and the dissipated energy in these diodes will be small. The capacitance of the diodes will therefore be small; as a consequence, the capacitance of the series connection of the diode pair 300 and the semiconductor device 100 will also be small.

Diodes 301 and 302 can be externally added to the semiconductor device 100 or they can be integrated on the same semiconductor crystal as device 100; or can be included in the same package as device 100.

Figure 6:
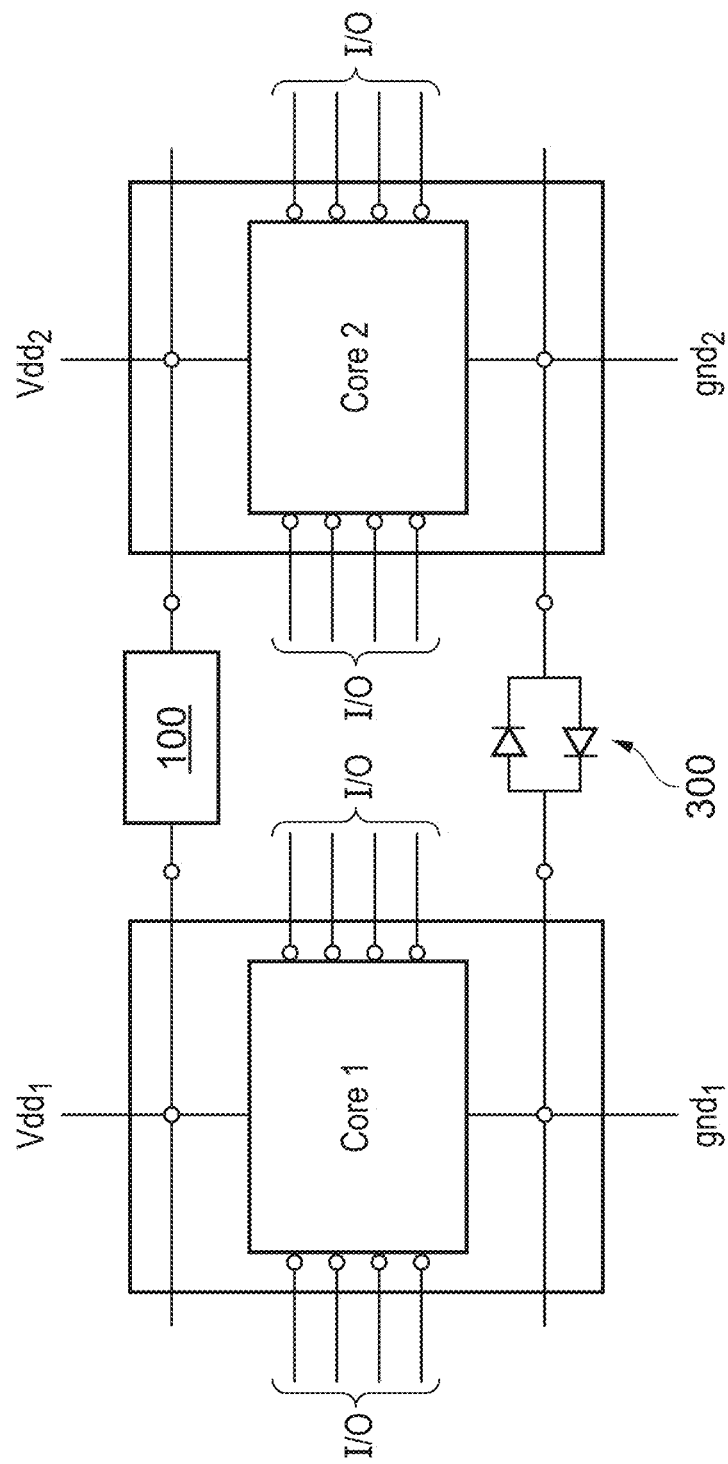
FIG. 6 illustrates an application of the semiconductor device according to embodiments for ESD protection in an integrated circuit arrangement.

Another application of the device according to the embodiments can be in the field of integrated circuits. As illustrated in FIG. 6 an Integrated circuit can include two or more power domains $Vdd_1$ and $Vdd_2$ associated with Cores 1 and 2 of the integrated circuit. The grounds $gnd_1$ and $gnd_2$ of the domains are frequently connected by a pair of antiparallel diodes 602 in order to provide an ESD-current path between the Cores 1 and 2. There is typically no direct ESD-current path between the supply voltage lines $Vdd_1$ and $Vdd_2$. The device 100 according to embodiments can be placed between power supply lines $Vdd_1$ and $Vdd_2$ (provided that the threshold voltage of device 100 is larger than the difference between the two supply voltages and during normal operation the integrated circuit the device 100 according to embodiments will be in the non-conducting mode. However, during an ESD event the device according to embodiments will be in conducting mode thus providing an additional ESD-current path between two different voltage domains.

In the context of the present application the skilled person would understand the term first conductivity type can refer to either p-type material or n-type material and that the second conductivity will be the opposite type to the first conductivity type. For example, where the first conductivity type is p-type, the second conductivity type will be n-type, or vice versa. Consequently the semiconductor device 100 can be a p-channel (or PMOS) device or alternatively an n-channel (NMOS) device.

Figure 7:
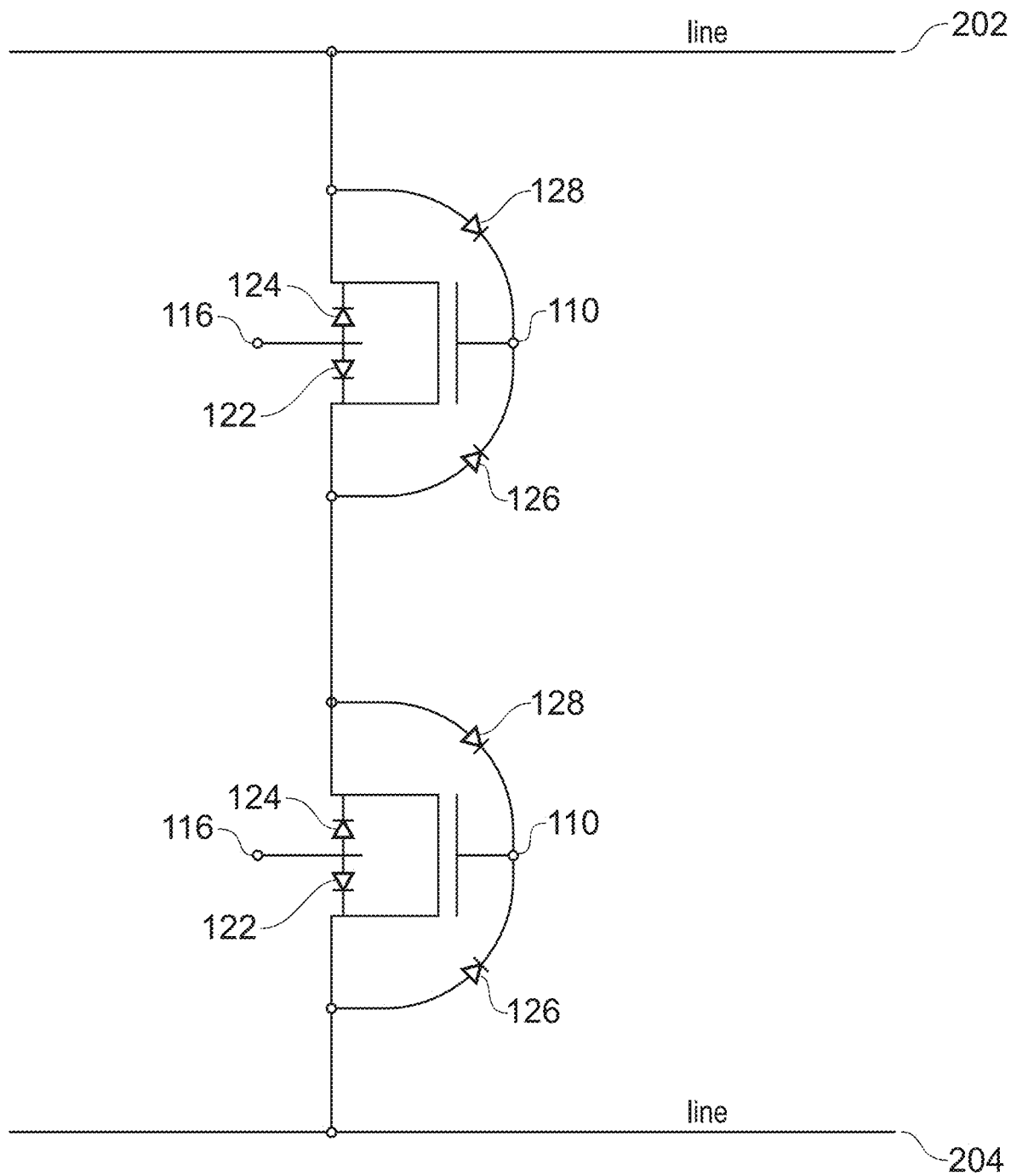
FIG. 7 illustrates a series arrangement of the semiconductor device according to FIG. 2.

The skilled person would also understand that device 100 according to embodiments can be combined with other devices. For example, device 100 connected in series with another such device as illustrated in FIG. 7, thus doubling the threshold voltage. The device 100 might also be used in a trigger structure used for triggering another device such as a silicon controlled rectifier (SCR).

Particular and preferred aspects of the invention are set out in the accompanying independent claims. Combinations of features from the dependent and/or independent claims can be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims can be formulated to such features during prosecution of this application or of any such further application derived there from. In particular, with reference to the appended claims, features from dependent claims can be combined with those of the independent claims and features from respective independent claims can be combined in any appropriate manner and not merely in specific combinations enumerated in the claims.

Features which are described in the context of separate embodiments can also be provided in combination in a single embodiment. Conversely, various features which are, for brevity, described in the context of a single embodiment, can also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A semiconductor device arrangement for bidirectional operation, the semiconductor device arrangement comprising:
   a field effect transistor comprising:
      a semiconductor substrate body of a first conductivity type;
      a first terminal region and a second terminal region each formed of a second conductivity type opposite the first conductivity type, the first terminal region being separated from the second terminal region by a dividing portion of the semiconductor substrate body; and
      a first terminal and a second terminal, wherein the first terminal and the second terminal are input terminals;
   a control terminal arranged above the dividing portion;
   a body terminal arranged opposing the control terminal and in the semiconductor substrate body;
   a first control diode connected and arranged between the first terminal and the control terminal; and
   a second control diode connected and arranged between the second terminal and the control terminal;
   a first body diode symmetrically arranged opposite the first control diode in the semiconductor substrate body between the body terminal and the first terminal region; and
   a second body diode symmetrically arranged opposite the second control diode in the semiconductor substrate body between the body terminal and the second terminal region;
   wherein the first terminal and the second terminal are connected to respective first and second signal lines.

2. The semiconductor device arrangement of claim 1, wherein the first diode has an anode that is connected to the first terminal and a cathode of the first diode is connected to the control terminal, and the second diode has an anode that is connected to the second terminal and a cathode of the second diode is connected to the control terminal.

3. The semiconductor device arrangement of claim 1, wherein the first diode has a cathode that is connected to the first terminal and an anode of the first diode is connected to the control terminal, and wherein the second diode has a cathode that is connected to the second terminal and an anode of the second diode is connected to the control terminal.

4. An electrostatic discharge protection arrangement comprising the semiconductor device arrangement of claim 1.

5. An integrated circuit comprising a first domain and a second domain; wherein the first domain is connected to the second domain by the semiconductor device arrangement of claim 1.

6. A method of operating a semiconductor device arrangement, comprising:
  connecting a first terminal of the semiconductor device arrangement to a first signal line carrying a first bias voltage and connecting a second terminal to a second signal line carrying a second bias voltage; and
  forward biasing a first control diode connected and arranged between the first terminal and a control terminal and reverse biasing a second control diode connected and arranged between the second terminal and the control terminal;
  wherein the voltage on the control terminal is substantially equal to the voltage on the first terminal, and
  wherein the semiconductor device further comprises a first body diode symmetrically arranged opposite the first control diode in a semiconductor substrate body of the semiconductor device, a second body diode symmetrically arranged opposite the second control diode in a semiconductor substrate body of the semiconductor device, and a further terminal region having a further terminal, where the first body diode is in blocking mode and the second body diode is in forward mode, so that a voltage on the further terminal region of the field effect transistor is substantially equal to the voltage on the second terminal.

7. The method of operating the semiconductor device arrangement of claim 6, wherein the voltage on the control terminal is equal to a bias voltage less the forward voltage of the first diode.

8. The method of operating the semiconductor device arrangement of claim 6, wherein the first terminal, the second terminal, and the control terminal are terminals of a field effect transistor.

9. The method of operating the semiconductor device arrangement of claim 6, wherein the voltage on the further terminal is higher than the voltage on the second terminal by an amount equal to a forward voltage the second body diode.

10. A method of manufacturing a semiconductor device arrangement for bidirectional operation, the method comprising:
  forming a field effect transistor comprising a first input terminal, a second input terminal, a control terminal, and a body terminal;
  arranging a first control diode to be connected between the first input terminal and the control terminal;
  arranging a second control diode to be connected between the second input terminal and the control terminal;
  symmetrically arranging a first body diode opposite the first control diode in a semiconductor substrate body of the semiconductor device between the body terminal and the first terminal; and
  symmetrically arranging a second body diode opposite the second control diode in the semiconductor substrate body between the body terminal and the second terminal region;
  wherein the first input terminal and the second input terminal are connected to respective first and second signal lines.

* * * * *